United States Patent
Watanabe

(10) Patent No.: US 9,806,239 B2
(45) Date of Patent: Oct. 31, 2017

(54) LIGHT EMITTING DEVICE

(71) Applicants: CITIZEN ELECTRONICS CO., LTD., Fujiyoshida-shi, Yamanishi (JP); CITIZEN HOLDINGS CO., LTD., Tokyo (JP)

(72) Inventor: Yusuke Watanabe, Fujiyoshida (JP)

(73) Assignees: Citizen Electronics Co., Ltd., Tokyo (JP); Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 15/064,868

(22) Filed: Mar. 9, 2016

(65) Prior Publication Data
US 2017/0025586 A1    Jan. 26, 2017

(30) Foreign Application Priority Data
Mar. 10, 2015  (JP) ................. 2015-047668

(51) Int. Cl.
| | |
|---|---|
| *H01L 33/00* | (2010.01) |
| *H01L 33/50* | (2010.01) |
| *H01L 33/48* | (2010.01) |
| *H01L 33/60* | (2010.01) |
| *H01L 33/62* | (2010.01) |

(52) U.S. Cl.
CPC .......... *H01L 33/505* (2013.01); *H01L 33/486* (2013.01); *H01L 33/60* (2013.01); *H01L 33/62* (2013.01)

(58) Field of Classification Search
CPC . H01L 27/14629; H01L 33/405; H01L 33/46; H01L 33/60
USPC .............................. 257/98, 99, 100
See application file for complete search history.

(56) References Cited

U.S. PATENT DOCUMENTS

| | | | | |
|---|---|---|---|---|
| 7,687,823 B2* | 3/2010 | Amo | ............... | H01L 33/486 257/100 |
| 7,696,527 B2* | 4/2010 | Uemoto | ............. | H01L 24/11 257/99 |
| 8,558,272 B2* | 10/2013 | Sanpei | ........... | F21K 9/00 257/88 |
| 9,117,982 B2* | 8/2015 | Ishihara | ......... | H01L 33/505 |
| 2007/0205425 A1* | 9/2007 | Harada | ........... | H01L 33/58 257/98 |

FOREIGN PATENT DOCUMENTS

| | | |
|---|---|---|
| JP | 2005-268707 | 9/2005 |
| JP | 2009-283988 | 12/2009 |

* cited by examiner

*Primary Examiner* — Tan N Tran
(74) *Attorney, Agent, or Firm* — RatnerPrestia

(57) ABSTRACT

A light emitting device includes a substrate, a light emitting element mounted on the substrate, a phosphor plate for covering an upper surface of the light emitting element, a white reflecting resin placed on the substrate to surround side surfaces of the light emitting element and the phosphor plate, and a reflecting frame, including a reflecting film formed by plating and a bonding portion, and placed on the substrate to surround the light emitting element, the phosphor plate, and the white reflecting resin. The reflecting frame is directly bonded to the substrate by the bonding portion in a portion where the white reflecting resin is not located.

6 Claims, 5 Drawing Sheets

LIGHT EMITTING DEVICE

CROSS-REFERENCE TO RELATED APPLICATIONS

This application is based upon and claims the benefit of priority of prior Japanese Patent Application No. 2015-047668, filed on Mar. 10, 2015, the entire contents of which are incorporated herein by reference.

TECHNICAL FIELD

The present invention relates to a light emitting device including a semiconductor light emitting element.

BACKGROUND

In recent years, light emitting devices which obtain white light using a combination of a phosphor and a semiconductor light emitting element such as an LED element (light-emitting diode) have come into practical use. One such light emitting device is known to include a reflecting frame placed to surround the light emitting element and the phosphor to increase the intensity of light emitted in a desired direction.

Japanese Laid-open Patent Publication No. 2009-283988, for example, discloses a light-emitting diode including a light-emitting diode element mounted on the main surface of a substrate. A plate member including a cylindrical opening portion to receive the light-emitting diode element is bonded to the main surface of the substrate. A reflector is placed on the surface of the plate member opposite to that bonded to the substrate.

Japanese Laid-open Patent Publication No. 2005-268708 discloses a semiconductor light emitting device including a light emitting element mounted on the bottom surface defining a mortar-shaped cavity formed in a case. A space above the cavity is filled with a light-transmitting resin containing a phosphor dispersed in it. A reflecting frame having an inclined surface forming a reflecting surface is placed on the case.

SUMMARY

The light-emitting diode disclosed in Japanese Laid-open Patent Publication No. 2009-283988 can use the reflector to reflect light emitted by the light-emitting diode element toward the reflector to improve the light use efficiency. However, since a plate member is located between the reflector and the substrate, the bonding strength between the reflector and the substrate is relatively low, thus making the reflector more likely to be detached.

With the semiconductor light emitting device disclosed in Japanese Laid-open Patent Publication No. 2005-268708, light emitted by the semiconductor light emitting element toward the reflecting frame can be reflected by the reflecting frame and guided in nearly the radiation direction of the semiconductor light emitting element to improve the light use efficiency. However, to fabricate a semiconductor light emitting device disclosed in Japanese Laid-open Patent Publication No. 2005-268708, it may be preferable to cut the interior of the case to form a mortar-shaped cavity and place a semiconductor light emitting element and a light-transmitting resin in the cavity, thus degrading the manufacturing efficiency.

It is an object of the present invention to improve the bonding strength of a reflecting frame of a light emitting device while preventing degradation in manufacturing efficiency of the light emitting device.

A light emitting device according to an embodiment includes a substrate, a light emitting element mounted on the substrate, a phosphor plate for covering an upper surface of the light emitting element, a white reflecting resin placed on the substrate to surround side surfaces of the light emitting element and the phosphor plate, and a reflecting frame, including a reflecting film formed by plating and a bonding portion, and placed on the substrate to surround the light emitting element, the phosphor plate, and the white reflecting resin. The reflecting frame is directly bonded to the substrate by the bonding portion in a portion where the white reflecting resin is not located.

Preferably, the reflecting frame includes a second bonding portion and is further bonded to an upper surface of the white reflecting resin by the second bonding portion.

Preferably, the substrate includes a first recessed portion in a portion bonded to the bonding portion.

Preferably, the reflecting frame includes a second recessed portion formed between the bonding portion and the second bonding portion.

Preferably, a lower end portion of an outer side surface of the reflecting frame is covered with an adhesive.

Preferably, the light emitting element and the phosphor plate are formed in a rectangular shape, and the reflecting frame is formed to surround the light emitting element and the phosphor plate in a rectangular shape.

Preferably, the substrate includes a filled via hole configured to supply a current to the light emitting element within the substrate, and the bonding portion of the reflecting frame is bonded onto the substrate at a position where the filled via hole is absent.

The present invention can improve the bonding strength of a reflecting frame of a light emitting device while preventing degradation in manufacturing efficiency of the light emitting device.

Other features and advantages of the present light emitting device will be apparent from the ensuing description, taken in conjunction with the accompanying drawings, in which:

DESCRIPTION OF EMBODIMENTS

Hereinafter, light emitting devices according to an embodiment, will be described with reference to the drawings. However, it should be noted that the technical scope of the invention is not limited to these embodiments, and extends to the inventions described in the claims and their equivalents.

Figure 1A:
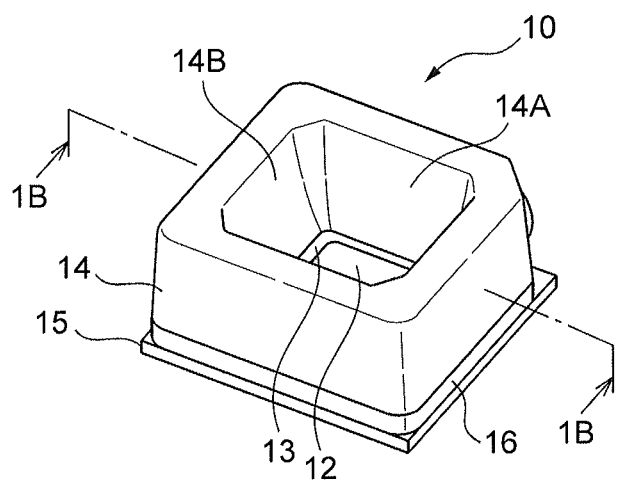
FIG. 1A is a perspective view illustrating a light emitting device 10.
Figure 1B:
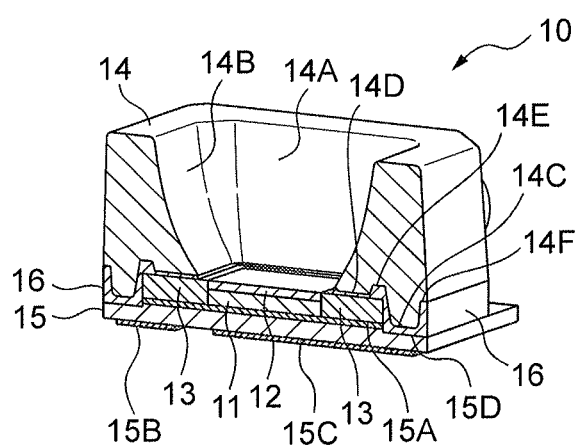
FIG. 1B illustrates a sectional view of the light emitting device 10 and a schematic view of a reflecting frame 14.

FIG. 1A is a schematic perspective view illustrating a light emitting device 10. FIG. 1B is a sectional view of the light emitting device 10 taken along a line 1B-1B in FIG. 1A when viewed obliquely sideways.

The light emitting device 10 includes an LED element 11, a phosphor plate 12, a white reflecting resin 13, a reflecting frame 14, and a substrate 15.

The LED element 11 is mounted on the substrate 15. The upper surface of the LED element 11 is covered with the phosphor plate 12 containing a specific phosphor. With this arrangement, the light emitting device 10 combines light which is emitted by the LED element 11 and emerges from the phosphor plate 12 with light generated by wavelength conversion by the phosphor plate 12 to obtain white light.

The LED element 11 serves as a blue semiconductor light emitting element (blue element). Examples of the LED element 11 include an InGaN compound semiconductor in the light-emitting wavelength range of 440 to 455 nm. The LED element 11 is formed in a rectangular shape.

The phosphor plate 12 contains a colorless transparent resin such as an epoxy resin or a silicone resin and covers the upper surface of the LED element 11. The phosphor plate 12 is mixed by dispersion with a granular phosphor material which absorbs blue light emitted by the LED element 11 and turns it into yellow light by wavelength conversion. The range of peak wavelengths of light generated by wavelength conversion by the phosphor material mixed by dispersion into the phosphor plate 12 is 535 to 570 nm. Examples of the phosphor material include a cerium-doped YAG (yttrium/aluminum/garnet) phosphor. The phosphor plate 12 is formed in the same rectangular shape as that of the LED element 11 when viewed from above.

The white reflecting resin 13 is obtained by, e.g., mixing reflective fine particles such as titanium oxide or alumina into a silicone resin and thermally curing the resin. The white reflecting resin 13 is placed on the substrate 15 to surround and cover the side surfaces of the LED element 11 and the phosphor plate 12. The white reflecting resin 13 reflects light laterally emitted by the LED element 11 and light laterally emerging from the phosphor plate 12 to the LED element 11 and the phosphor plate 12. Covering the side surfaces of the LED element 11 and the phosphor plate 12 with the white reflecting resin 13 makes it possible to suppress light leakage from the side surfaces of the light emitting device 10.

The reflecting frame 14 is a nearly rectangular frame body made of a molded resin in accordance with the size of an opening portion 14A. The reflecting frame 14 is formed using a resin base, on which a reflecting film is formed by plating. Side surfaces 14B of the reflecting frame 14 on the inner side (the side of the opening portion 14A) are inclined. The side surfaces 14B reflect light laterally emerging from the phosphor plate 12 to the side above the light emitting device 10 (the side of the phosphor plate 12 when viewed from the LED element 11). The plating may be wet plating such as electroplating or chemical plating, or dry plating such as vacuum deposition, chemical vapor deposition (CVD), or sputtering, and is not particularly limited.

The reflecting frame 14 includes a first bonding portion 14C and is placed on the substrate 15 to surround the LED element 11, the phosphor plate 12, and the white reflecting resin 13 in a rectangular shape. The reflecting frame 14 is directly bonded to the substrate 15 by the first bonding portion 14C in a portion where the white reflecting resin 13 is not located. The reflecting frame 14 is bonded to the substrate 15 by, e.g., an adhesive 16. The reflecting frame 14 may be bonded to the substrate 15 by other means such as soldering. Since the reflecting frame 14 is directly bonded to the substrate 15, the bonding strength of the reflecting frame 14 can further be improved to make the reflecting frame 14 harder to detach.

The reflecting frame 14 includes a second bonding portion 14D and is further bonded to the upper surface of the white reflecting resin 13 by the second bonding portion 14D. The reflecting frame 14 is bonded to the upper surface of the white reflecting resin 13 by, e.g., an adhesive 16. The reflecting frame 14 may be bonded to the upper surface of the white reflecting resin 13 by other means such as adhesive tape or an adhesive sheet. Bonding the reflecting frame 14 to the upper surface of the white reflecting resin 13 makes it possible to further improve the bonding strength of the reflecting frame 14 to make the reflecting frame 14 harder to detach.

The reflecting frame 14 further includes a recessed portion 14E formed between the first bonding portion 14C and the second bonding portion 14D. In this embodiment, the recessed portion 14E is formed at the end portions, bonded to the side surfaces of the white reflecting resin 13, of the surface of the reflecting frame 14 bonded to the upper surface of the white reflecting resin 13. The formation of a recessed portion 14E makes it possible to increase the amount of adhesive 16 inserted between the reflecting frame 14 and the white reflecting resin 13 and, in turn, to improve the bonding strength between the reflecting frame 14 and the white reflecting resin 13. A projecting portion is formed by the adhesive 16 inserted into the recessed portion 14E. The formed projecting portion can restrain the reflecting frame 14 from moving horizontally with respect to the substrate 15.

The reflecting frame 14 further includes a recessed portion 14F formed at the lower end portions of the outer side surfaces. The recessed portion 14F is covered with an adhesive 16. A projecting portion is formed by the adhesive 16 that covers the recessed portion 14F. The formed projecting portion can restrain the reflecting frame 14 from moving horizontally with respect to the substrate 15. It is also possible to restrain light laterally emitted by the LED element 11 and light laterally emerging from the phosphor plate 12 from leaking from the side surfaces of the light emitting device 10 through the white reflecting resin 13.

Figure 1C:
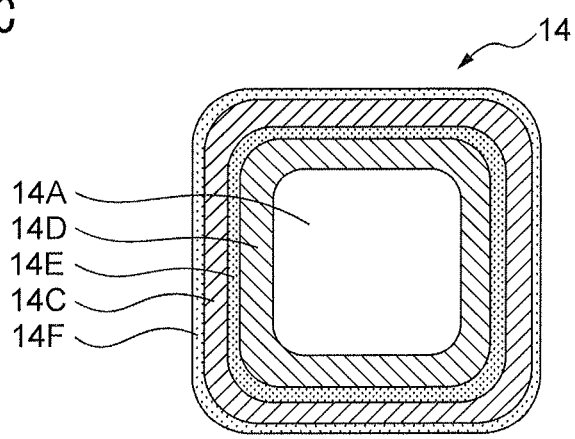
FIG. 1C is a schematic view illustrating the reflecting frame 14.

FIG. 1C is a schematic view illustrating the reflecting frame 14, when viewed from below, as not bonded to the substrate 15 and the white reflecting resin 13.

The reflecting frame 14 includes an opening portion 14A, a second bonding portion 14D, a recessed portion 14E, a first bonding portion 14C, and a recessed portion 14F in the order named from the inside, when viewed from below, as depicted as FIG. 1C.

Since the reflecting frame 14 is formed in a rectangular shape, light emitted by the light emitting device 10 propagates in a rectangular shape. When the light emitting device 10 is employed as lighting for capturing photographs using, e.g., a cellular phone, the entire capture range can be uniformly illuminated in accordance with this range.

The substrate 15 is implemented in an insulating substrate, such as a glass epoxy substrate, a BT resin substrate, a ceramic substrate, or a metal core substrate, including the LED element 11 mounted on its surface. A wiring layer 15A having a circuit pattern and electrodes for connection with the LED element 11 is formed on the substrate 15. Each electrode of the LED element 11 is mounted on the substrate 15 by flip-chip packaging and electrically connected to the connection electrode on the wiring layer 15A via a bump (not illustrated). Each electrode of the LED element 11 may be connected to the connection electrode on the wiring layer 15A via a conductive adhesive material such as an Ag paste, a wire by wire bonding, or the like.

Electrodes 15B and 15C to be connected to an external DC (Direct Current) power supply are formed on the lower surface (the surface opposite to that on which the wiring layer 15A is formed) of the substrate 15. One of the electrodes 15B and 15C serves as an anode electrode while the other of them serves as a cathode electrode.

The substrate 15 includes a recessed portion 15D in a portion bonded to the first bonding portion 14C of the reflecting frame 14. The recessed portion 15D is formed by cutting the outer peripheral portion of the substrate 15 at the position bonded to the white reflecting resin 13. In general, the thicknesses of the LED element 11 and the phosphor plate 12 vary in each individual. A recessed portion 15D can be formed to absorb individual variations in thickness of the LED element 11 and the phosphor plate 12. Therefore, even when the LED element 11 and the phosphor plate 12 have small thicknesses, since the reflecting frame 14 is directly bonded to the upper surface of the white reflecting resin 13 by the second bonding portion 14D of the reflecting frame 14, it is possible to prevent the reflecting frame 14 from separating from the upper surface of the white reflecting resin 13 and, in turn, to prevent a reduction in bonding strength between the reflecting frame 14 and the white reflecting resin 13.

Since the formation of a recessed portion 15D allows the adhesive 16 to enter the recessed portion 15D to bond the side surfaces of the reflecting frame 14 to those defining the recessed portion 15D, the bonding strength between the substrate 15 and the reflecting frame 14 can be improved. Further, since the formation of the recessed portion 15D leads to a high projecting portion formed by the adhesive 16 inserted between the reflecting frame 14 and the side surfaces of the white reflecting resin 13, the reflecting frame 14 can be restrained from moving horizontally with respect to the substrate 15. Since the reflecting frame 14 can be located below the surface of the substrate 15, i.e., the lower surface of the LED element 11, light laterally emitted by the LED element 11 can be restrained from leaking from the side portions of the light emitting device 10 via the white reflecting resin 13.

In the light emitting device 10, the bonding strength of the reflecting frame 14 to the substrate 15 can be improved. This makes it possible to reduce the area of contact between the reflecting frame 14 and the substrate 15 in the horizontal direction with respect to the substrate 15 to downsize the light emitting device 10 in the horizontal direction with respect to the substrate 15.

To set the intensity of light emitted by the light emitting device 10 equal to or higher than a predetermined value, the height of the side surfaces of the reflecting frame 14 on the inner side (the side of the opening portion 14A), i.e., the distance from the upper surface of the phosphor plate 12 to that of the reflecting frame 14 may be preferably set equal to or larger than a predetermined length. If the entire lower surface of the reflecting frame 14 is bonded onto the substrate 15 with no white reflecting resin 13, the inner side surfaces of the reflecting frame 14 are formed starting from the same level as that of the upper surface of the substrate 15, i.e., the lower surface of the LED element 11. However, as described above, the thicknesses of the LED element 11 and the phosphor plate 12 vary in each individual. Therefore, if the entire lower surface of the reflecting frame 14 is bonded onto the substrate 15 with no white reflecting resin 13, in order to set the height of the inner side surfaces of the reflecting frame 14 so as to be equal to or higher than a predetermined length, the reflecting frame 14 must be formed so as to be sufficiently high based on individual variations in thickness of the LED element 11 and the phosphor plate 12.

The reflecting frame 14 according to this embodiment is bonded onto the white reflecting resin 13 and has its inner side surfaces formed starting from the same level as that of the upper surface of the white reflecting resin 13, i.e., the upper surface of the phosphor plate 12. This makes it possible to ignore individual variations in thickness of the LED element 11 and the phosphor plate 12, thus involving not too high a reflecting frame 14. This, in turn, makes it possible to downsize the light emitting device 10 in a direction perpendicular to the substrate 15.

Figure 2A:
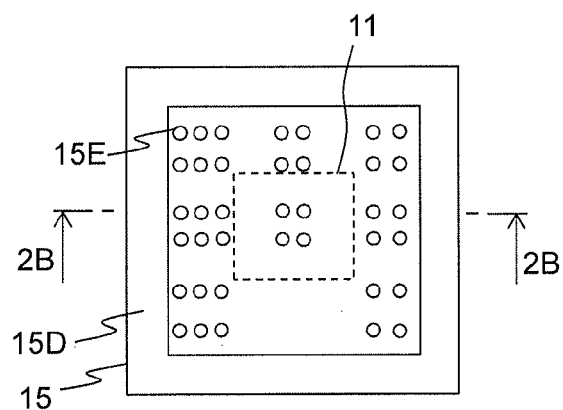
FIG. 2A is a schematic top view illustrating a substrate 15.
Figure 2B:
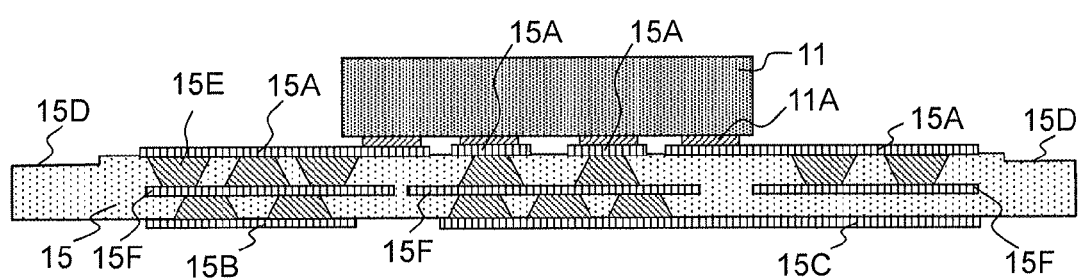
FIG. 2B is a schematic sectional view illustrating the substrate 15.

FIG. 2A is a schematic top view illustrating the substrate 15 as equipped with none of the LED element 11, the phosphor plate 12, the white reflecting resin 13, and the reflecting frame 14, with no wiring layer 15A. FIG. 2B is a sectional view taken along a line 2B-2B in FIG. 2A.

The substrate 15 includes filled via holes 15E to supply a current to the LED element 11 within the substrate 15, as illustrated in FIGS. 2A and 2B. Each connection electrode 11A of the LED element 11 connected to the wiring layer 15A is electrically connected to the electrodes 15B and 15C via the filled via holes 15E and a wiring layer 15F within the substrate 15.

Since heat generated by the LED element 11 is transferred to the electrodes 15B and 15C via the filled via holes 15E, the filled via holes 15E can improve the heat radiation performance of the LED element 11. When the light emitting device 10 is employed as lighting for capturing photographs using, e.g., a cellular phone, the amount of light can be reduced in a short period of time.

The recessed portion 15D is formed in the substrate 15 at the position where the filled via holes 15E are absent, as illustrated again in FIGS. 2A and 2B. In other words, the first bonding portion 14C of the reflecting frame 14 is bonded onto the substrate 15 at the position where the filled via holes 15E are absent. This makes it possible to improve the bonding strength of the reflecting frame with respect to the substrate while maintaining a given heat radiation performance of the LED element 11.

The recessed portion 15D is formed in the substrate 15 at the position where the wiring layer 15A is absent. In other words, the first bonding portion 14C of the reflecting frame 14 is bonded onto the substrate 15 at the position where the wiring layer 15A is absent. The second bonding portion 14D of the reflecting frame 14 is bonded onto the substrate 15 via the white reflecting resin 13. Therefore, since the reflecting frame 14 is not directly connected to the wiring layer 15A, it is possible to prevent generation of gaps due to the presence of grooves and projections in the wiring layer 15A and damage inflicted on the wiring layer 15A by the reflecting frame 14, in the portion between the wiring layer 15A and the substrate 15.

Figure 3A:
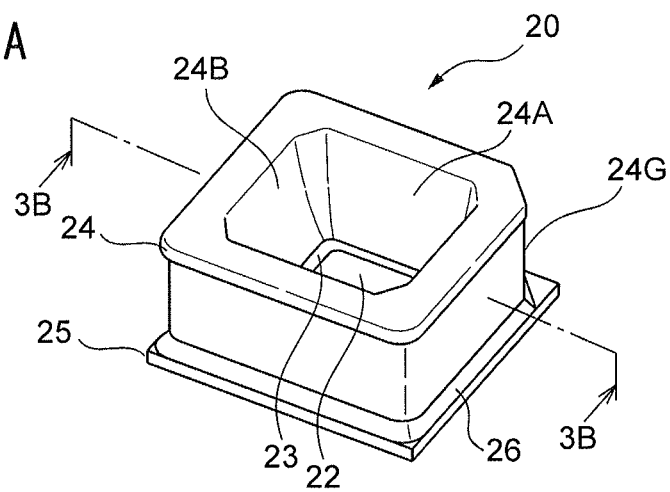
FIG. 3A is a perspective view illustrating a light emitting device 20.
Figure 3B:
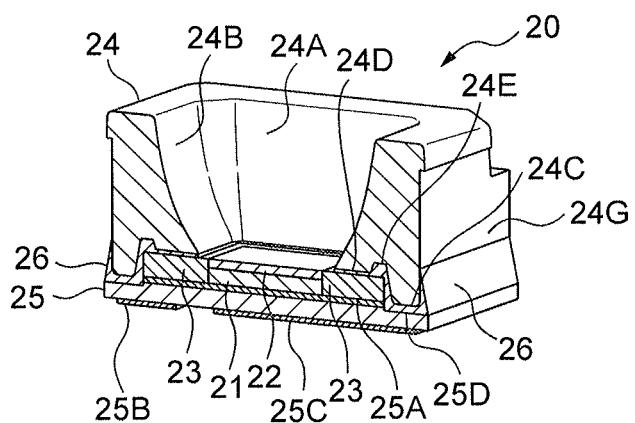
FIG. 3B is a sectional view illustrating the light emitting device 20.
Figure 3C:
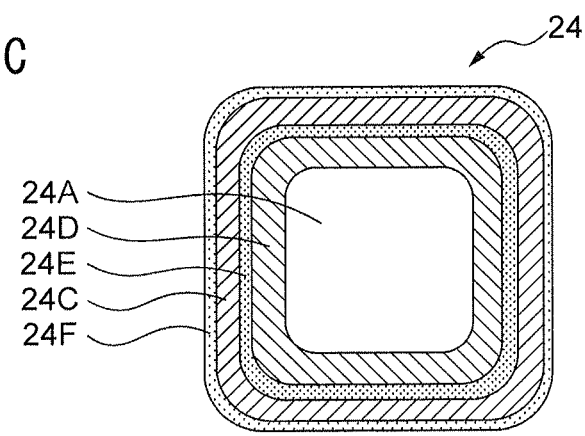
FIG. 3C is a schematic view illustrating a reflecting frame 24.

FIG. 3A is a schematic perspective view illustrating a light emitting device 20. FIG. 3B is a sectional view of the light emitting device 20 taken along a line 3B-3B in FIG. 3A when viewed obliquely sideways. FIG. 3C is a schematic view illustrating a reflecting frame 24, when viewed from below, as bonded to neither a substrate 25 nor a white reflecting resin 23.

The light emitting device 20 includes each unit of the light emitting device 10. However, in the reflecting frame 24 of the light emitting device 20, no reflecting film is formed at the lower end portion of the outer periphery of the reflecting frame 24 by plating, and a resin 24G forming the reflecting frame 24 is exposed. In the reflecting frame 24, the lower end portions of its outer side surfaces are covered with an adhesive 26, as in the reflecting frame 14.

In other respects, the light emitting device 20 has the same configuration as that of the light emitting device 10.

Figure 4:
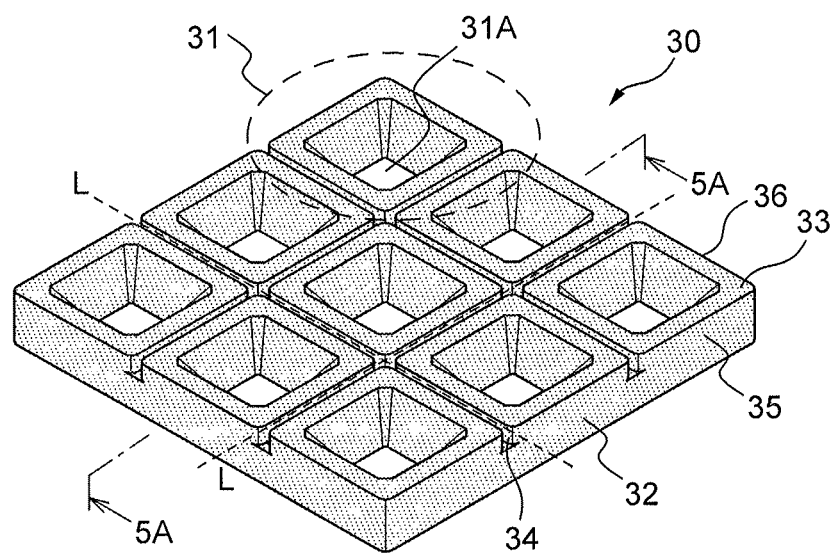
FIG. 4 is a perspective view illustrating a component assembly 30.
Figure 4:
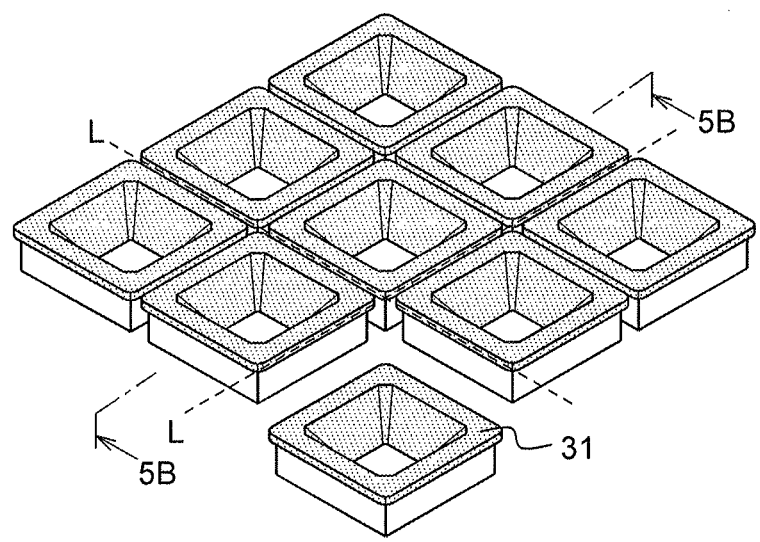
Figure 5A:
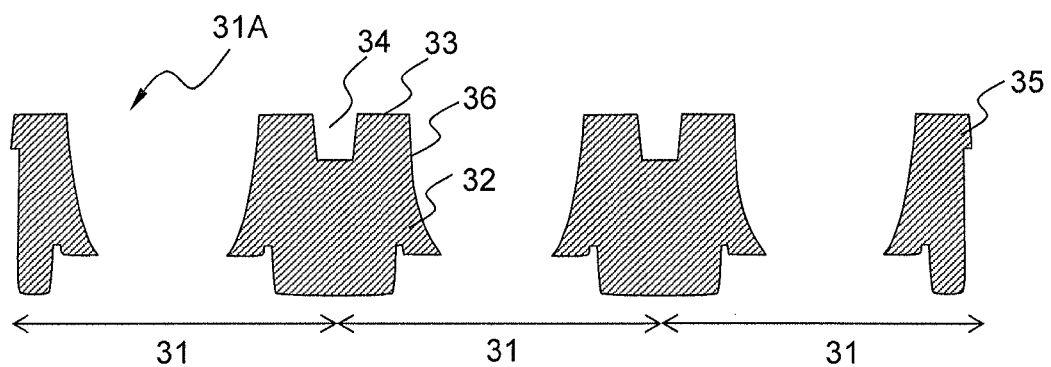
FIG. 5A is a sectional view of the component assembly 30.
Figure 5B:
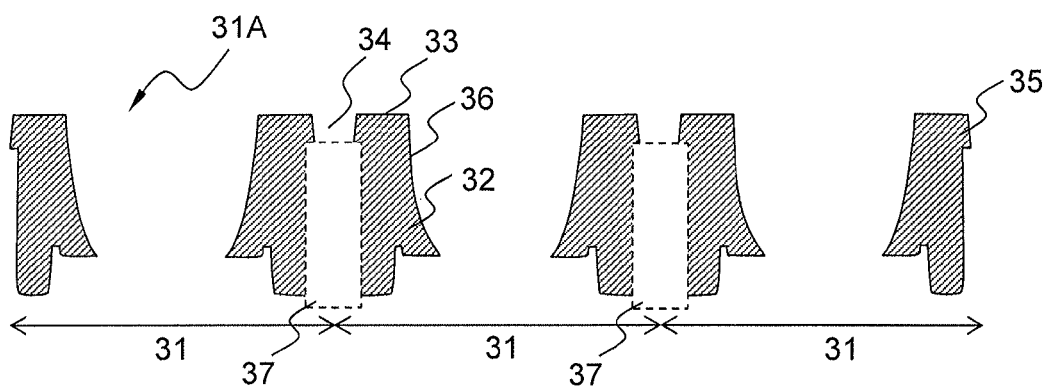
FIG. 5B is another sectional view of the component assembly 30.

FIGS. 4A and 4B are perspective views illustrating a component assembly 30 of the reflecting frame 24. FIGS. 5A and 5B are sectional views of the component assembly 30 taken along a line 5A-5A in FIG. 4A and a line 5B-5B in FIG. 4B, respectively.

FIG. 4A illustrates the component assembly 30 of the reflecting frame 24. Each individual component (reflecting frame) 31 serves as a rectangular frame body and includes a rectangular opening portion 31A at its center. In an example illustrated in FIG. 4A, a total of nine components 31 are integrally arrayed in a matrix. Cutting the component assembly 30 on vertical and horizontal cutting-plane lines L yields individual components 31. The number of components 31 within the component assembly 30 may be larger or smaller than nine illustrated in FIG. 4A.

A recessed portion 34 is formed in an upper surface 33 of a base 32 of the component assembly 30 to coincide with each cutting-plane line L, as illustrated in FIG. 4A. The recessed portion 34 has a width smaller than the contact width of a dicing blade used to dice the component assembly 30. A plating film 36 is formed on the upper surface 33 and side surfaces 35 of the base 32. A plating film 36 is formed not only on the upper surface 33 and the side surfaces 35 of the base 32 but also on the surface defining the recessed portion 34. The plating film 36 is formed to cover the side and bottom surfaces defining the recessed portion 34 without completely filling the recessed portion 34.

FIG. 4B illustrates the component assembly 30 when one component 31 is cut by dicing along the cutting-plane lines L. Upon dicing for the component assembly 30, the base 32 is cut from the lower surface side (the side opposite to the upper surface 33) of the component assembly 30 to the intermediate depth of the recessed portion 34, as illustrated in FIG. 5B. A thus formed cut portion 37 and recessed portion 34 are used to divide adjacent components 31 to obtain one component 31.

Since a plurality of reflecting frames 24 can thus be fabricated from one component assembly 30, it is possible to improve the manufacturing efficiency of the reflecting frames 24 and to reduce the manufacturing cost of the reflecting frames 24.

As described above, in each of the light emitting devices 10 and 20, a reflecting frame is directly bonded to the substrate in a portion where the white reflecting resin is not located, it is possible to improve the bonding strength of the reflecting frame. Since a reflecting frame can be easily formed, it is also possible to prevent degradation in manufacturing efficiency of the light emitting device.

This embodiment has exemplified the case where the reflecting frame 14 is bonded to the upper surface of the white reflecting resin 13. However, a reflecting frame 14 may be formed such that the inner side surfaces 14B of the reflecting frame 14 fall outside the white reflecting resin 13 so as not to bond the reflecting frame 14 to the upper surface of the white reflecting resin 13. Even when the reflecting frame 14 is not bonded to the upper surface of the white reflecting resin 13, the light emitting device 10 can improve the bonding strength of the reflecting frame while preventing degradation in manufacturing efficiency.

The light emitting devices 10 and 20 can be employed as light sources such as backlights on large-area liquid crystal displays. The light emitting devices 10 and 20 can also be adopted for a variety of illumination light sources such as light guide plate lighting on small-area liquid crystal displays for cellular phones and the like, and backlight units for various meters and indicators.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light emitting device comprising:
   a substrate;
   a light emitting element mounted on the substrate;
   a phosphor plate for covering an upper surface of the light emitting element;
   a white reflecting resin placed on the substrate to surround side surfaces of the light emitting element and the phosphor plate; and
   a reflecting frame, including a reflecting film formed by plating, a first bonding portion, and a second bonding portion provided inside of the first bonding portion, and placed on the substrate to surround at least side surfaces of the light emitting element, the phosphor plate, and the white reflecting resin,
   wherein the reflecting frame is directly bonded to the substrate by the first bonding portion in a portion where the white reflecting resin is not located, and is bonded to an upper surface of the white reflecting resin by the second bonding portion.

2. The light emitting device according to claim 1, wherein the substrate includes a first recessed portion in a portion bonded to the first bonding portion.

3. The light emitting device according to claim 1, wherein the reflecting frame includes a second recessed portion formed between the first bonding portion and the second bonding portion.

4. The light emitting device according to claim 1, wherein a lower end portion of an outer side surface of the reflecting frame is covered with an adhesive.

5. The light emitting device according to claim 1, wherein
   the light emitting element and the phosphor plate are formed in a rectangular shape, and
   the reflecting frame is formed to surround the light emitting element and the phosphor plate in a rectangular shape.

6. The light emitting device according to claim 1, wherein the substrate includes a filled via hole configured to supply a current to the light emitting element within the substrate, and the first bonding portion of the reflecting frame is bonded onto the substrate at a position where the filled via hole is absent.

\* \* \* \* \*